(12) United States Patent
Hauck et al.

(10) Patent No.: US 9,230,917 B2
(45) Date of Patent: Jan. 5, 2016

(54) METHOD OF PROCESSING A CARRIER WITH ALIGNMENT MARKS (71) Applicant: Infineon Technologies Dresden GmbH, Dresden (DE)

(72) Inventors: Tarja Hauck, Dresden (DE); Alessia Sciré, Dresden (DE); Dieter Kaiser, Dresden (DE); Andreas Greiner, Grosserkmannsdorf (DE); Morgana Nicolo, Dresden (DE); Carolin Wetzig, Radeburg (DE); Dietrich Burmeister, Dresden (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 13/904,122

(22) Filed: May 29, 2013

(65) Prior Publication Data
US 2014/0353852 A1    Dec. 4, 2014

(51) Int. Cl.
*H01L 21/301* (2006.01)
*H01L 21/46* (2006.01)
*H01L 21/78* (2006.01)
*H01L 23/544* (2006.01)

(52) U.S. Cl.
CPC ....... *H01L 23/544* (2013.01); *H01L 2223/5442* (2013.01); *H01L 2223/5446* (2013.01); *H01L 2223/54426* (2013.01); *H01L 2223/54453* (2013.01); *H01L 2924/0002* (2013.01)

(58) Field of Classification Search
CPC .................... H01L 23/544; H01L 2223/54426
USPC .................... 257/E23.179; 438/401, 462, 975
See application file for complete search history.

(56) References Cited

U.S. PATENT DOCUMENTS

| 5,316,966 | A | * | 5/1994 | Van Der Plas et al. | 438/401 |
| 8,546,961 | B2 | * | 10/2013 | Farooq et al. | 257/797 |
| 2011/0076830 | A1 | * | 3/2011 | Nogami et al. | 438/401 |
| 2013/0200786 | A1 | * | 8/2013 | Meinhold | 313/586 |

OTHER PUBLICATIONS

I. Mizushima et al. "Empty-space-in-silicon technique for fabricating a silicon-on-nothing structure", Applied Physics Letters, vol. 77, No. 20, pp. 3290-3292, Nov. 13, 2000.
Tsutomu Sato et al. "Fabrication of Silicon-on-Nothing Structure by Substrate Engineering Using the Empty-Space-in-Silicon Formation Technique", Japanese Journal of Applied Physics, vol. 43, No. 1, 2004, pp. 12-18.

* cited by examiner

*Primary Examiner* — Howard Weiss (57) ABSTRACT

A method for processing a carrier may include forming at least one recess structure at least one of over and in the carrier; and annealing the at least one recess structure such that at least one hollow chamber is formed by material of the at least one recess structure, wherein the at least one hollow chamber may form an optical alignment structure.

18 Claims, 8 Drawing Sheets

METHOD OF PROCESSING A CARRIER WITH ALIGNMENT MARKS

TECHNICAL FIELD

Various embodiments relate generally to a method for processing a carrier, to a carrier, and to a method for forming an optical alignment structure for a lithographic process in a carrier.

BACKGROUND

Manufacturing a chip or an integrated circuit may in general include various layering and patterning processes, e.g. for processing a power chip, and therefore, a plurality of alignments may be necessary during processing. According to this, the alignment marks used for the positioning of the carrier during the processes, e.g. during layering, patterning or ion implantation, may degrade during the plurality of processes; and therefore may be visible in less quality and may be detectable in less accuracy, so that the alignment marks may need to be refreshed several times during manufacturing a chip. In various processes, the alignment marks may be covered with an additional material and, therefore, may be not suitable to enable an accurate alignment. Commonly used alignment marks may not be stable at high processing temperatures, e.g. larger than 1000° C.

SUMMARY

A method for processing a carrier may include forming at least one recess structure at least one of over and in the carrier; and annealing the at least one recess structure such that at least one hollow chamber is formed by material of the at least one recess structure, wherein the at least one hollow chamber forms an optical alignment structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The proper alignment of a carrier during a lithographic process may be an important aspect in the manufacturing of a semiconductor device, a chip, or an integrated circuit. Optical alignment systems may detect an alignment structure on a carrier using for example an optical microscope. There may be various possibilities for creating an alignment structure (or alignment structure elements or alignment marks) on a carrier and for detecting an alignment structure on the carrier. But these commonly used alignment methods may suffer from the problem, that the alignment structure elements or the alignment marks on the carrier may be detected in an optical system with less accuracy, while the carrier is running through the various steps of the manufacturing.

For example, a plurality of material layers may be deposited over a carrier, e.g. a plurality of silicon layers, and therefore, the alignment structure elements or the alignment marks may be detectable with less accuracy in an optical alignment system with increasing thickness of the material covering the alignment structure elements or the alignment marks. Further, e.g. covering the alignment structure elements or the alignment marks with a material layer during a manufacturing process, at least one of the shape, the size, and the aspect ratio of the alignment structure elements or the alignment marks may change, and therefore, an alignment may not be possible with the necessary alignment accuracy, e.g. providing overlay errors in the nanometer range. Further, a commonly used alignment mark may change at least one of its size, shape and position during a thermal treatment, so that the commonly used alignment structures may not be reliable throughout the whole manufacturing process.

According to various embodiments, a method for processing a carrier may be provided, using a so-called empty-space-in-silicon technique, or a so-called venetia process to form an alignment structure (e.g. an alignment mark, a plurality of alignment marks, or an alignment structure, e.g. a hollow chamber or a plurality of hollow chambers) in a carrier, e.g. in a silicon substrate, in a silicon wafer, or in a carrier including a silicon surface layer, e.g. a silicon on insulator substrate (SOI). According to various embodiments, the alignment structure, as described herein, may be hollow chambers, e.g. hollow chambers covered with carrier material, also referred to as buried alignment structure. Since a buried alignment structure may not be detectable in a standard optical alignment system using visible light, according to various embodiments, an infrared optical alignment system may be used to detect the buried alignment structure. Therefore, the buried alignment structure (or a hollow chamber) may be visible through a material layer covering the alignment structure (or the hollow chamber), which may allow the use of the buried alignment structure during the manufacturing of a chip, wherein the quality of the buried alignment structure, and therefore the alignment accuracy for the alignment of the carrier, may be maintained during the manufacturing process. According to various embodiments, the alignment accuracy may remain the same, even though the alignment marks may be covered with a material layer, e.g. with a silicon layer having a layer thickness larger than 5 µm or larger than 10 µm or even larger than 20 µm. In other words, forming a buried alignment structure and using an infrared alignment system may avoid the need of additional alignment marks, indirect alignments, and/or forming refreshed alignment marks such that the alignment accuracy during a manufacturing process may not decrease, and therefore the overlay accuracy of the lithographic masks may not be reduced during manufacturing a chip.

According to various embodiments, a layering process (or layering) may be included in the method for processing a carrier. In a layering process, a layer may be deposited over a surface (e.g. over a carrier, over a wafer, over a substrate, over another layer, or the like) using deposition techniques, which may include chemical vapor deposition (CVD, or a CVD process) and physical vapor deposition (PVD, or a PVD process), according to various embodiments (a layering process may therefore include depositing a material). According to various embodiments, the thickness of a deposited layer may be in the range of a few nanometers up to several micrometers depending on its specific function. Further, according to various embodiments, a layer may include at least one of an electrically insulating material, an electrically semiconducting material, and an electrically conductive material, depending on the respective specific function of the layer. According to various embodiments, modifications of PVD and CVD processes may be used in the method for processing a carrier.

According to various embodiments, a layering process may further include forming a resist layer or depositing a resist layer, e.g. using spin coating or spray coating and the like.

According to various embodiments, a patterning process (or patterning) may be included in the method for processing a carrier. According to various embodiments, a patterning process may include removing selected portions of a surface layer or removing selected portions of a material. According to various embodiments, a plurality of trenches, recesses and/or holes may be formed in a carrier or in a surface layer using a patterning process. According to various embodiments, patterning a layer may be used to form a patterned layer, e.g. a mask layer. Since a plurality of processes may be involved, according to various embodiments, there are various possibilities to perform a patterning process, wherein aspects may be: selecting at least one portion of a surface layer (or a material or of a carrier) which shall be removed, e.g. using at least one lithographic process; and removing the selected portions of a surface layer, e.g. using at least one etch process.

According to various embodiments, a variety of lithographic processes may be applied to generate a mask layer (e.g. a patterned resist layer), for example photolithography, microlithography or nanolithography, electron beam lithography, X-ray lithography, ultraviolet lithography, extreme ultraviolet lithography, interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process, may be applied to remove organic or inorganic contaminations from a surface (e.g. from a surface layer, from a carrier, from a wafer, and the like) by for example wet chemical treatment. According to various embodiments, the initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied to remove a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). According to various embodiments, the preparation process may include applying a liquid or gaseous adhesion promoter (e.g. bis(trimethylsilyl)amine (HMDS)).

According to various embodiments, a resist may be applied to cover a surface (e.g. a surface layer, a carrier, or a wafer, and the like). According to various embodiments, applying a resist may include spin coating or spray coating to generate a resist layer. Afterwards, a resist may be prebaked to drive off excess resist solvent, according to various embodiments. According to various embodiments, several types of resists (e.g. photoresists) may be used adapted to the process of exposing the resist to achieve desired results. According to various embodiments, positive photoresists (e.g. DNQ-Novolac, PMMA, PMIPK, PBS, and the like) may be used, whereby the resist that has been exposed to light becomes soluble to a photoresist developer, and/or negative photoresists (e.g. SU-8, poly isoprene, COP, and the like) may be used, whereby the resist that has been exposed to light becomes insoluble to a photoresist developer.

According to various embodiments, a resist may be exposed (e.g. by exposing a resist to a pattern of light) to transfer a desired pattern to a resist, e.g. using light or electrons, wherein the desired pattern may be defined by a patterned lithographic mask (e.g. a glass carrier with a patterned chromium layer used for exposing the resist layer). According to various embodiments, mask-less lithography may be applied, wherein a precise beam (e.g. an electron beam or a laser beam) may be projected directly onto the surface including a resist without using a mask. According to various embodiments, the exposure to light may cause a reaction in a resist that may allow that some of the resist may be removed by a special solution (a so-called developer, e.g. a photoresist developer).

Since the resolution of an optical imaging process may be limited by the used wavelength, the wavelength of the used light may range from the wavelength of the visible light to smaller wavelengths in the ultra violet range, according to various embodiments. According to various embodiments, the exposure may be performed using X-rays or electrons having even shorter wavelengths than ultra violet light. Projection exposure systems (steppers or scanners) may be used projecting a mask many times onto a surface including a resist to create the complete exposure pattern.

According to various embodiments, a lithographic process may include developing a resist (e.g. developing a photoresist using a photoresist developer) to partially remove the resist to generate a patterned resist layer (e.g. on a surface layer or on a carrier, a wafer, and the like). According to various embodiments, developing a resist may include a post exposure bake (a heat treatment, e.g. rapid thermal processing) before the actual developing process may be performed. According to various embodiments, the developing process may include a special chemical solution (a so-called developer) as for example sodium hydroxide or tetramethylammonium hydroxide (TMAH, a metal ion free developer). According to various embodiments, the patterned resist layer may be solidified in a hard bake process (a heat treatment, e.g. rapid thermal processing), realizing a more durable protecting layer for later processes.

Independently of the described lithographic processes, a resist layer or a patterned resist layer may be removed completely (or partially) at a desired processing stage (e.g. after an ion implantation process) in a so-called resist strip process. According to various embodiments, a resist may be removed chemically and/or by using oxygen plasma.

It should be noted, that a lithographic process, according to various embodiments, including exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a prior deposited or grown layer, wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a prior deposited layer, a grown surface layer, or from a carrier (or substrate, or wafer), and the like.

According to various embodiments, a patterned layer of a hard mask material may serve as a mask for processes like etching or forming recesses, trenches, or holes at desired positions into a carrier or into a surface layer. Further, according to various embodiments, a patterned photoresist may also serve as a mask (a so-called soft mask). The mask material may usually be selected with regard to specific needs as for example chemical stability or mechanical stability, e.g. to protect regions from being etched, or to define the shape of structure elements to be generated during a layering process, and the like.

Since the desired shapes and structure elements may be generated in their exact dimensions (feature size) during a patterning process, patterning may be the most critical process to generate structure elements or electronic devices. Errors during a patterning process may cause a distorted pattern or a misplaced pattern and therefore may change the electrically functioning of a device or of an integrated circuit. Misplacement of a respective structure element (e.g. misplacement of a doped region in a carrier, or misplacement of a structure element), e.g. due to overlay errors, may have negative effects on the functionality of the structure element. Therefore, the patterning process may define a critical feature size. According to various embodiments, there may be several possibilities to reduce overlay errors, e.g. by reducing the number of involved lithographic processes. According to various embodiments, using a buried alignment structure may reduce the number of necessary lithographic processes (or patterning processes) for manufacturing a semiconductor device, e.g. a power semiconductor device, e.g. CoolMOS transistor, e.g. a photosensor, e.g. a microelectromechanical system, since the buried alignment structure may be visible, in sufficient high quality, through a material covering the buried alignment structure and therefore, the alignment structure may not be refreshed during a manufacturing process. According to various embodiments, an alignment mark may be referred to as an alignment structure.

According to various embodiments, the carrier (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

Figure 1:
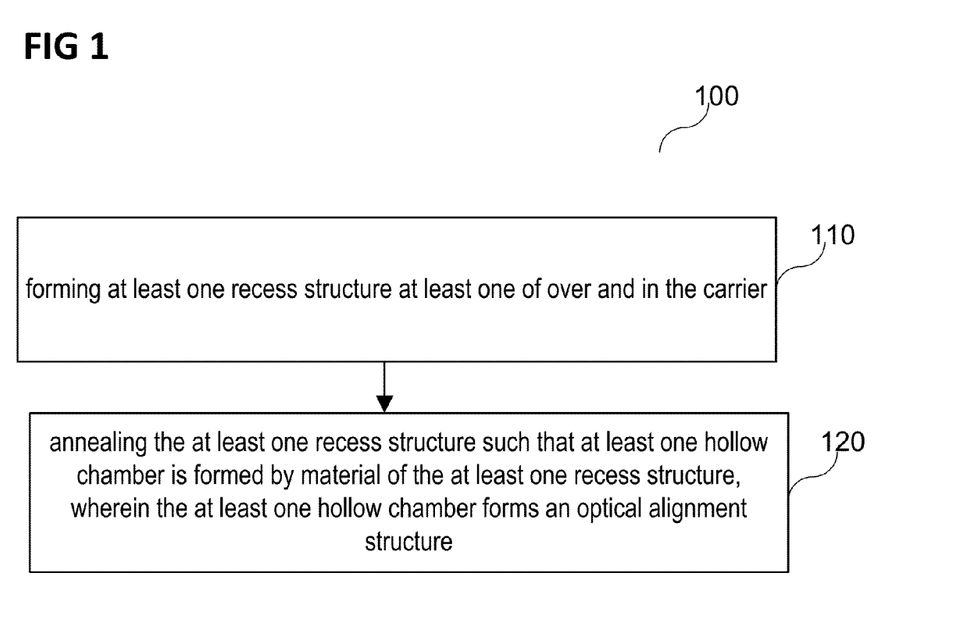
FIG. 1 shows a flow diagram of a method for processing a carrier, according to various embodiments.

FIG. 1 shows a flow diagram of method 100 for processing a carrier. According to various embodiments, method 100 may include, in 110, forming at least one recess structure at least one of over and in the carrier; and, in 120, annealing the at least one recess structure such that at least one hollow chamber is formed by material of the at least one recess structure, wherein the at least one hollow chamber forms an optical alignment structure.

Figure 2A:
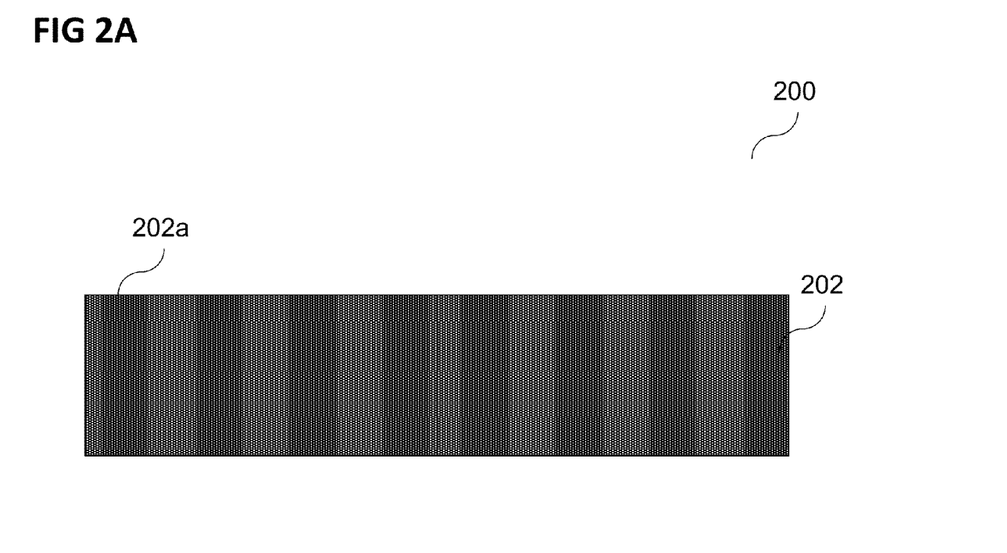
FIG. 2A to FIG. 2E show respectively cross-sectional views of a carrier at different processing stages during processing, according to various embodiments.

FIG. 2A shows a carrier at an initial processing stage, e.g. before process 110 of method 100 may be applied. The carrier 202 may be a silicon wafer 202 or a silicon substrate 202, according to various embodiments. According to other embodiments, the carrier 202 may be an arbitrary type of carrier, as already described, including a carrier surface layer, wherein the carrier surface layer may be a silicon layer, e.g. having a thickness of several micrometers, e.g. larger than 5 µm (not shown in figures). According to various embodiments, forming at least one recess structure in carrier 202 (e.g. in a silicon substrate 202 or in a silicon wafer 202), as described herein, may be applied in analogy to a carrier 202 having a silicon surface layer, which may be not described in more detail for sake of brevity.

According to various embodiments, process 110 of forming at least one recess structure at least one of over and in the carrier may include forming at least one recess structure in the carrier. According to various embodiments, process 110 of forming at least one recess structure at least one of over and in the carrier may include patterning the carrier. Therefore, according to various embodiments, a patterned mask layer may be arranged over the carrier, wherein the patterned mask layer may at least partially cover the carrier and may expose at least one region of the carrier, and subsequently carrier material may be partially removed from the at least one exposed region of the carrier to form at least one recess structure in the carrier 202.

Figure 2B:
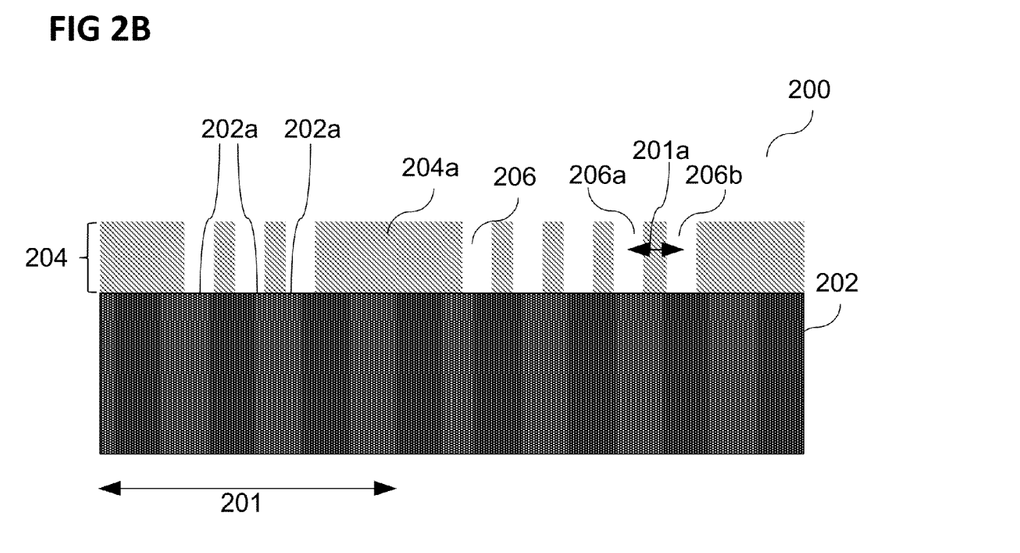

As shown in FIG. 2B, according to various embodiments, a patterned mask layer 204 including openings 206 may be formed over the carrier 202 by using at least one of a layering process, a patterning process, and a lithographic process. According to various embodiments, forming at least one recess structure may include forming at least one of a patterned hard mask layer 204 and a patterned soft mask layer 204 over the carrier 202. According to various embodiments, the patterned mask layer 204, e.g. the patterned hard mask layer 204 or the patterned soft mask layer 204, may include at least one of the following materials (mask layer materials 204a): an organic material, a polymer, a resist, a photoresist, an inorganic material, an oxide, a nitride, polysilicon, silicon oxide, silicon nitride, a transition metal nitride, a metal, an alloy, and the like. According to various embodiments, forming a patterned soft mask layer 204 may include a lithographic process, as already described herein, including at least applying a resist layer, exposing the resist layer, and developing the resist layer (wherein the resist may be partially removed).

According to various embodiments, forming a patterned hard mask layer 204 may include at least a layering process, to form the hard mask material layer 204, and a patterning process, to pattern the hard mask material layer 204, including a least a lithographic process (for selecting regions of the hard mask material layer) and an etch process (for removing the selected regions of the hard mask material layer), as already described herein.

According to various embodiments, the patterned mask layer 204 may at least partially expose the carrier surface 202a. According to various embodiments, the openings 206 exposing partially the carrier surface 202a are illustrated in FIG. 2B in a cross sectional view. According to various embodiments, the cross section of the openings 206 of the patterned mask layer 204 may have a rectangular shape or a quadratic shape. According to various embodiments, the corresponding base area of the recess, which is not visible in FIG. 2B, may have a rectangular shape, a quadratic shape, a polygonal shape, or a circular shape, or any other suitable shape to generate a hollow chamber in a subsequently performed process, e.g. in process 120 of method 100.

According to various embodiments, the openings 206 may expose a plurality of surface regions of the carrier 202. According to various embodiments, the openings 206 may be arranged, e.g. using a lithographic process, to expose a plurality of surface regions of the carrier 202 such that a plurality of recesses may be formed in the carrier 202 as described later referring to FIG. 2C. Therefore, according to various embodiments, the shape, the size, the positions, and the number of openings 206 of the patterned mask layer 204 may be selected in accordance with the desired recess structure to be formed in the carrier 202.

According to various embodiments, the openings 206 of the patterned mask layer 204 may have a width, measured in width direction 201 parallel to the surface 202a of the carrier 202 (wherein a height direction or depth direction may be perpendicular to the width direction 201), in the range from about several nanometers to about several micrometers, e.g. in the range from about 100 nm to about 10 µm, e.g. in the range from about 500 nm to about 1 µm, e.g. in the range from about 0.7 µm. According to various embodiments, the distance between at least two adjacent openings 206a, 206b of the plurality of openings 206 may be in the range from about several nanometers to about several micrometers, e.g. in the range from about 100 nm to about 5 µm, e.g. in the range from about 500 nm to about 2 µm, e.g. in the range from about 1 µm. According to various embodiments, the distance between at least two adjacent openings 206a, 206b of the plurality of openings 206 may be the distance 201a measured from center to center of the at least two adjacent openings 206a, 206b.

According to various embodiments, after the patterned mask layer 204 (hard mask or soft mask) may be formed, process 110 may further include at least one etch process to partially remove carrier material to form at least one recess structure in the carrier 202. According to various embodiments, the at least one etch process to partially remove carrier material forming at least one recess structure may include a dry etch process, e.g. reactive ion etching, e.g. deep reactive ion etching. According to various embodiments, an etch process, as described herein, may include at least one of the following etch chemistries: $SF_6$, $O_2$, HBr, $NF_3$, $C_4F_8$, and $C_4F_6$. According to various embodiments, the etch process may be selective to the carrier material, e.g. selective to silicon, such that the patterned mask layer may be used to remove the carrier material partially at the desired positions, and therefore, forming at least one recess structure at a desired position. According to various embodiments, the at least one etch process may be performed such that the at least one recess structure may be generated having a desired depth. According to various embodiments, as described herein, a recess structure may include a recess and carrier material surrounding the recess. According to various embodiments, the recesses included in the at least one recess structure may have an aspect ratio (the ratio of the depth of the recess to the width of the recess), in the range from about 2 to about 10. According to various embodiments, the patterned mask layer 204 may be removed after the plurality of recesses (or the at least one recess structure) has been formed in the carrier.

Figure 2C:
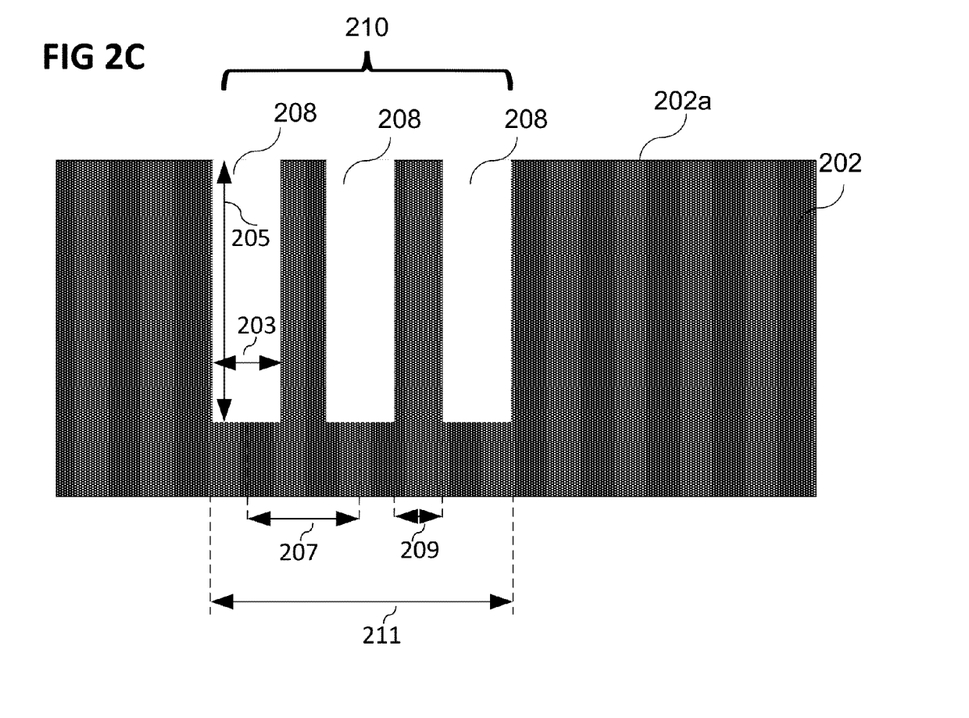

According to various embodiments, as shown in FIG. 2C, a plurality of recesses 208 may be formed in carrier 202, e.g. after process 110 of method 100 has been carried out. According to various embodiments, the plurality of recesses 208 may provide at least one recess structure 210. According to various embodiments, there may be no significant difference, if the plurality of recesses 208 is formed over the carrier 202, e.g. in a silicon layer formed over the carrier 202, or in the carrier 202. According to various embodiments, as shown in FIG. 2C, the carrier may be patterned using the patterned mask layer 204, as shown in FIG. 2B, and applying an etch process.

According to various embodiments, the plurality of recesses 208 may provide the at least one recess structure 210, as illustrated for example in a cross sectional view in FIG. 2C. According to various embodiments, the plurality of recesses 208 may be included in the at least one recess structure 210. According to various embodiments, each recess 208 of the plurality of recesses 208 may have a rectangular shape or a quadratic shape. According to various embodiments, the base area of a recess included in the at least one recess structure 210 may have the shape as defined by the patterned mask layer 204, e.g. a rectangular shape, a quadratic shape, a polygonal shape, a circular shape or an elliptic shape. According to various embodiments, the recess may have the form (or shape) of a right prism, e.g. a cube, a cuboid, a cylinder and the like. The base area of a recess 208 included in the at least one recess structure 210 may have a hexagonal or an octagonal shape, such that at least one recess (or more than one recess or all recesses) may have the form (or shape) of a hexagonal right prism or an octagonal right prism, as shown and described in more detail referring to FIG. 3.

According to various embodiments, as shown in the cross sectional view in FIG. 2C, at least one recess 208 of the plurality of recesses 208, or all recesses of the plurality of recesses 208, may have a depth 205 in the range from about 1 µm to about 10 µm, e.g. in the range from about 2 µm to about 6 µm, e.g. in the range from about 4 µm, or e.g. larger than 4

μm or smaller than 4 μm. According to various embodiments, at least one recess 208 of the plurality of recesses 208, or all recesses of the plurality of recesses 208, may have a width 203 (or in the case of cylindrical shapes a diameter 203) in the range from about 0.1 μm to about 3 μm, e.g. in the range from about 0.2 μm to about 2 μm, e.g. in the range from about 0.5 μm to about 1 μm, e.g. in the range from about 0.7 μm, or e.g. larger than 0.7 μm or smaller than 0.7 μm. According to various embodiments, the distance 207 between two adjacent recesses 208 of a recess structure 210, measured from the center of the first recess to the center of the second recess, may be in the range from about 0.2 μm to about 5 μm, e.g. in the range from about 0.5 μm to about 2 μm, e.g. in the range from about 1 μm, or e.g. larger than 1 μm or smaller than 1 μm. Therefore, according to various embodiments, the width 209 of the remaining carrier material between two adjacent recesses 208 of the recess structure 210 may be, as a result of the width 203 and the distance 207, in the range from about 0.1 μm to about 2 μm.

Figure 2D:
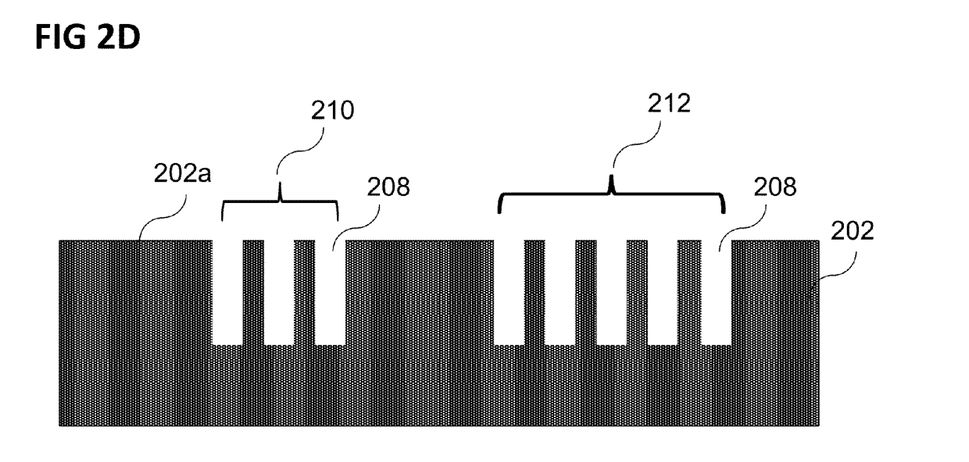

As shown in FIG. 2D, according to various embodiments, a plurality of recesses 208 may be arranged in the carrier 202, so that more than one recess structure may be provided in the carrier 202, e.g. two recess structures 210, 212, as shown in FIG. 2D, or e.g. more than two recess structures, e.g. three, four, five, six, seven, eight, nine, ten, or even more than ten recess structures. According to various embodiments, a plurality of recess structures may be arranged to provide an optical alignment structure for the carrier 202, as described referring to FIG. 4A in more detail. According to various embodiments, each recess structure of the plurality of recess structures may include at least three recesses 208. According to various embodiments, at least one recess structure (e.g. recess structure 212) may include more than three recesses 208, e.g. five recesses as shown in FIG. 2D, or any other number of recesses, e.g. four, six, seven, eight, nine, ten, or even more than ten, or more than 20 over even hundreds of recesses 208, depending on the desired shape and/or size of the hollow chamber, which may be formed subsequently in process 120 of method 100.

According to various embodiments, a recess structure (e.g. recess structure 210) may include three recesses 208 having the shape of identical hexagonal or octagonal right prisms (or cylinders) being arranged along a line in a specific direction parallel to the surface 202a of the carrier 202, wherein in this arrangement a hollow chamber may be formed by applying process 120, wherein the hollow chamber may have an elongated shape along this direction (e.g. having a pipe-shape). According to various embodiments, the size of the hollow chamber may increase, if the recess structure includes more recesses 208 (assuming that the recesses have the same shape, size and distance between each other), e.g. a hollow chamber formed by the recess structure 210 may be smaller than a hollow chamber formed by recess structure 212.

According to various embodiments, a recess structure (e.g. recess structure 210) may include more than three recesses having the shape of identical hexagonal or octagonal right prisms (or cylinders), e.g. six or nine recesses, arranged in a rectangular or quadratic arrangement referring to the top view of the carrier 202, therefore, extending in two different directions parallel to the surface 202a of the carrier 202, so that applying process 120 may result in the formation of a plate-shaped hollow chamber, extended along these two directions.

Figure 2E:
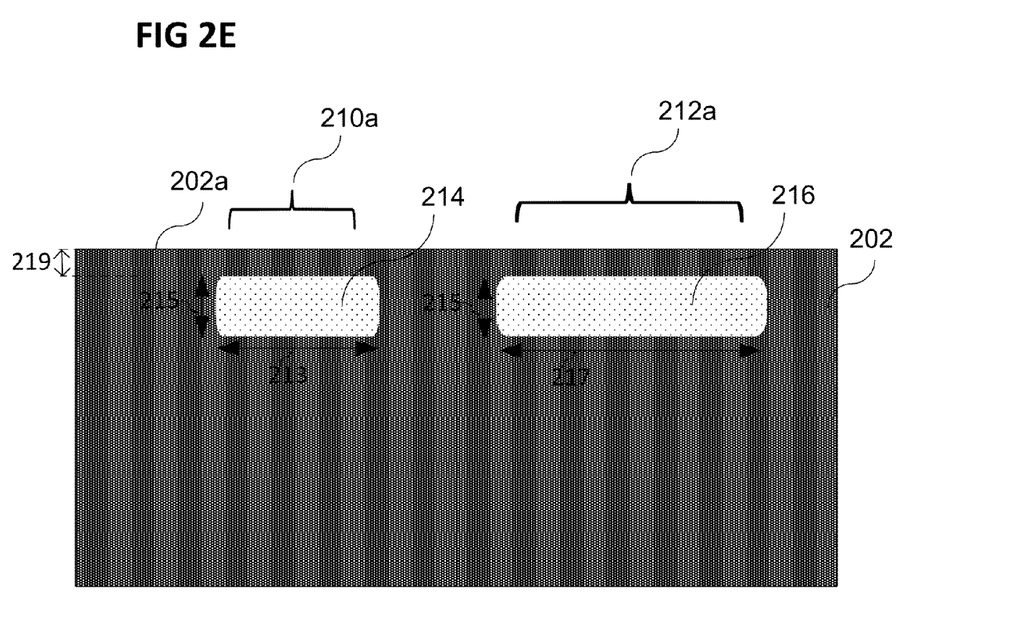

According to various embodiments, FIG. 2E illustrates a carrier 202 in a cross sectional view, after process 120 has been carried out, e.g. after an annealing process has been performed. According to various embodiments, at least one hollow chamber is formed due to the migration of material of the at least one recess structure, e.g. carrier material, e.g. silicon, e.g. the material surrounding the recesses 208, as shown in FIG. 2D. According to various embodiments, the migration of material of the recess structure 210 may form a hollow chamber 214 in a region 210a of the carrier 202 and the migration of material of the recess structure 212 may form a hollow chamber 216 in a region 212a of the carrier 202. According to various embodiments, the lateral extension 213, 217 of hollow chamber 214, 216 may be in a similar range as the lateral extension of the respective recess structure 210, 212, e.g. the lateral extension 213 of the hollow chamber 214 may be in a similar range as the lateral extension 211 of the recess structure 210 shown in FIG. 2C. According to various embodiments, a similar range as used herein may be a range wherein the two distances differ by less than 30% from each other, e.g. by less than 20%, e.g. by less than 10%, or even by less than 5%.

According to various embodiments, the hollow chamber formed by annealing a recess structure may be smaller than the recess structure, e.g. smaller in width and/or height, e.g. smaller in volume compared to the volume of the recesses included in the recess structure. According to various embodiments, the thickness of the material layer covering the hollow chamber 214, 216 may be in the micrometer range, e.g. in the range from about 0.5 μm to about 2 μm after the method 100 has been carried out. According to various embodiments, the material layer covering the hollow chamber 214, 216 may include silicon or the specific material surrounding the recesses 208.

According to various embodiments, the annealing process may cause at least one of migration, diffusion, material transport, and material rearrangement of the material surrounding the recesses 208 included in the recess structure 210, 212 while forming the hollow chamber 214, 216.

According to various embodiments, the annealing process may cause at least one of migration, diffusion, material transport, and material rearrangement of the silicon surrounding the plurality of recesses 208 of the recess structure 210, 212 to form the hollow chamber 214, 216.

According to various embodiments, the annealing process may be performed using temperatures in the range from about 800° C. to about 1400° C., e.g. in the range from about 900° C. to about 1300° C., e.g. in the range from about 1100° C. to about 1200° C. According to various embodiments, the duration of the annealing process may be at least in the range from about several minutes, e.g. larger than 5 min, e.g. larger than 10 min, e.g. larger than 20 min. According to various embodiments, the annealing process may be carried out under vacuum conditions. According to various embodiments, the annealing process may be carried out in the absence of a significant oxygen amount (or oxygen partial pressure), e.g. in nitrogen atmosphere, e.g. in an argon atmosphere, e.g. in a chemical reducing atmosphere including nitrogen and hydrogen (e.g. a mixture of nitrogen with 2% to 20% hydrogen), e.g. in a chemical reducing atmosphere including argon and hydrogen (e.g. a mixture of argon with 2% to 20% hydrogen).

According to various embodiments, the at least one hollow chamber 210 may be used as an alignment structure (or alignment mark), wherein the alignment of the carrier 202 may be carried out by using an infrared alignment system (e.g. a through silicon alignment tool), since the at least one hollow chamber 210 may be covered with material, after process 120 of method 100 has been carried out. According to various embodiments, the hollow chamber 214, 216, as shown in FIG. 2E may be visible using infrared light despite being covered with a silicon layer, after method 100 has been carried out.

According to various embodiments, silicon and doped silicon may be substantially transparent to infrared light, wherein the transparency may decrease with increasing doping concentration. According to various embodiments, the hollow chamber may be covered with a further material, wherein the further material may be substantially transparent to infrared light, wherein the charge carrier density in the material covering the at least one hollow chamber may influence the transparency of the further material to infrared light.

According to various embodiments, the hollow chamber may also be referred to as empty space in silicon structure and the material over the hollow chamber may be referred to as silicon on nothing structure or migrated silicon region.

According to various embodiments, the migrated silicon region may have a thickness in the range from about 0.5 μm to about 3 μm.

According to various embodiments, the size and/or the shape of the hollow chamber (e.g. hollow chamber 214, 216 as shown in FIG. 2E), the thickness of the migrated silicon region, and the position of the hollow chamber may be controlled or influenced by the design of the recess structure, and therefore, by patterning the carrier 202, which may be performed using processes of semiconductor industry.

According to various embodiments, the hollow chamber (e.g. hollow chamber 214, 216 as shown in FIG. 2E) may be surrounded by silicon, e.g. completely surrounded by silicon. In other words, the hollow chamber may not have an opening.

According to various embodiments, the size, the shape, and the position of the hollow chamber may not change or vary in a further heat treatment, wherein the further heat treatment may be carried out after method 100 has been finished. According to various embodiments, the hollow chamber may be stable in size, shape, and position up to temperatures of about 1300° C. According to various embodiments, the hollow chamber may be used as an alignment structure or as a part of a more complex alignment structure for carriers processed at high temperatures, as for example high temperature processes included in manufacturing integrated circuits, e.g. CMOS-structures, e.g. power semiconductor devices, e.g. transistors, e.g. photo sensors, or micro-electromechanical systems.

Figure 3:
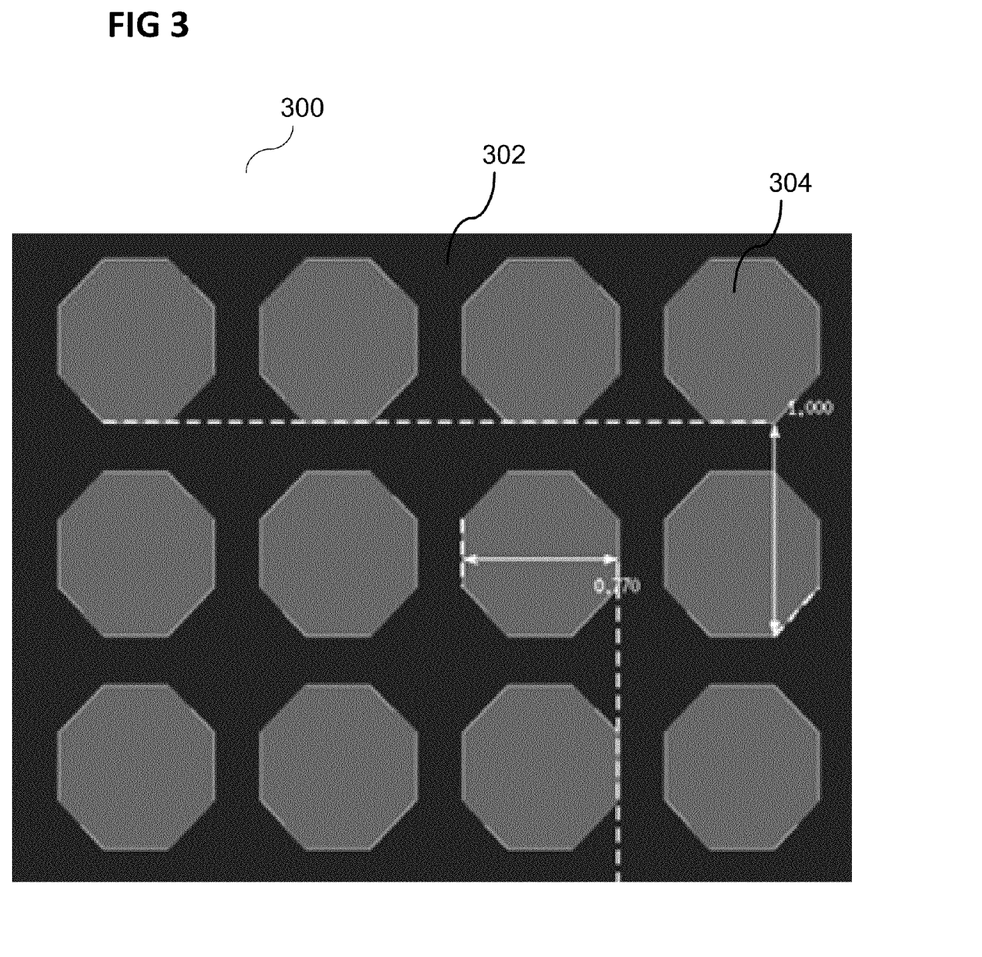
FIG. 3 shows a top view of a recess arrangement providing a recess structure, according to various embodiments.

FIG. 3 shows a top view of a recess structure 300, according to various embodiments, including a carrier 302, e.g. a silicon substrate, and a plurality of recesses 304, as already described. According to various embodiments, the recesses 304 may be right prisms having a regular octagon as base area. The size of the right prisms 304 may be in the range as already described before referring to FIG. 2C to FIG. 2E. According to various embodiments, the pitch, that means the distance between adjacent recesses 304, may be about 1 μm. According to various embodiments, the width of the recesses may be about 0.8 μm. According to various embodiments, the recess structure 300 may include a plurality of recesses 304, wherein the recess structure 300 itself may have a rectangular shape or a quadratic shape, referred to the top view. According to various embodiments, a recess structure may include a first number of recesses 304 arranged along a first direction and a second number of recesses 304 arranged along a second direction forming a rectangular shape, e.g. if the first direction may be perpendicular to the second direction. A recess structure may include a plurality of recesses 304 arranged in an arbitrary polygonal shape (seen from the top view).

According to various embodiments, an arrangement of recesses included in a recess structure may generate a hollow chamber in a desired shape. Therefore, according to various embodiments, the hollow chamber or the plurality of hollow chambers may be formed in a suitable shape to provide an optimal alignment structure.

Figure 4A:
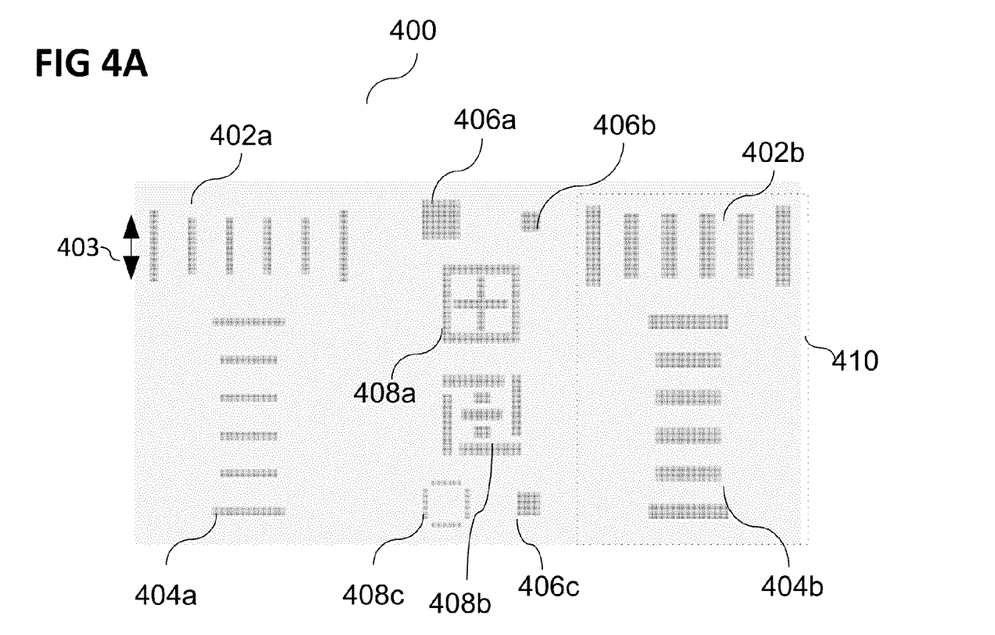
FIG. 4A shows a top view or a schematic view of optical alignment structures or recess structures, according to various embodiments.

FIG. 4A illustrates, according to various embodiments, various possible alignment structures 402a, 402b, 404a, 404b, 406a, 406b, 406c, 408a, 408b, 408c, and 410. According to various embodiments, since the shape of the recess structure may define or influence the shape of the hollow chamber formed during the annealing process 120, FIG. 4A may illustrate the shape of the recess structures and likewise the shape of the similar corresponding alignment structure. According to various embodiments, the shape of the recess structure (accordingly the arrangement of the recesses) may determine the shape of the optical alignment structure after the annealing process 120 has been carried out. The optical alignment structures 402a, 402b, 404a, 404b may respectively include a plurality of bars (or a plurality of hollow chambers having the shape of bars in the top view), as shown in FIG. 4A, wherein the bars may have different sizes, e.g. different lengths and/or different widths. According to various embodiments, the bars of the plurality of bars may be parallel to each other.

According to various embodiments, a recess structure 410 and therefore the corresponding optical alignment structure 410 may include a first set of bars 402b and a second set of bars 404b, as shown in FIG. 4A, wherein the bars of the first set of bars 402b may run perpendicular to the bars of the second set of bars 404b. According to various embodiments, the bars (or the hollow chambers having the shape of bars) may have a length 403 in the micrometer range, e.g. in the range from about 1 μm to about 20 μm, e.g. in the range from about 2 μm to about 10 μm, e.g. in the range from about 4 μm, e.g. in the range from about 8 μm, or e.g. in larger than about 20 μm, or smaller than about 1 μm.

According to various embodiments, a recess structure 406a, 406b, 406c and, therefore, the corresponding optical alignment structure 406a, 406b, 406c may have a quadratic shape, e.g. formed by an quadratic arrangement of recesses included in the recess structure, e.g. in analogy to the recess structure shown in FIG. 3. According to various embodiments, the quadratic optical alignment structures 406a, 406b, 406c (or the hollow chambers having a quadratic shape seen from the top) may have a size in the micrometer range, e.g. in the range from about 1 μm to about 20 μm, e.g. in the range from about 2 μm to about 10 μm, e.g. in the range from about 4 μm, e.g. in the range from about 8 μm, or e.g. in larger than about 20 μm, or smaller than about 1 μm.

According to various embodiments, a recess structure 408a, 408b, 408c and therefore the corresponding optical alignment structure 408a, 408b, 408c may have an arbitrary desired shape, which may be suitable for an optical alignment structure, as shown in FIG. 4A. According to various embodiments, the quadratic optical alignment structures 408a, 408b, 408c (or the hollow chambers forming the optical alignment structures 408a, 408b, 408c) may have a size in the micrometer range, as already described.

Figure 4B:
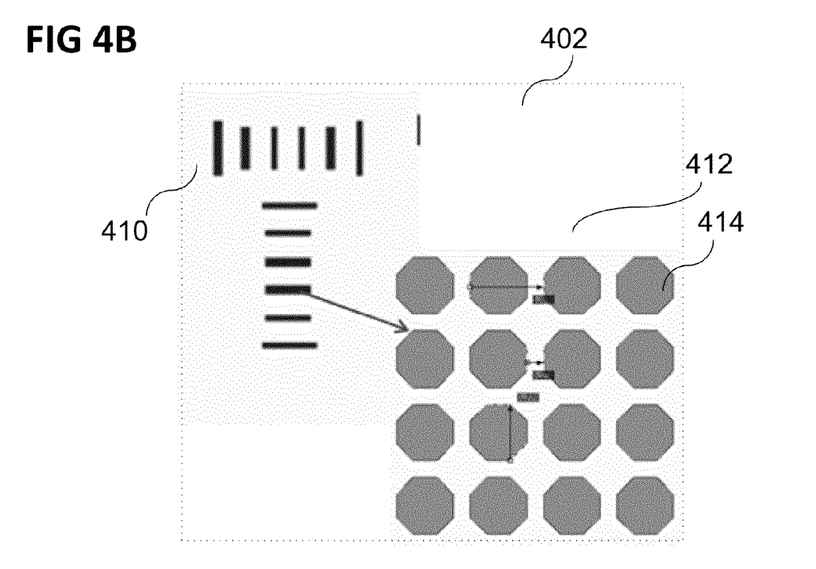
FIG. 4B shows a top view or a schematic view of recess structures in detail, according to various embodiments.

FIG. 4B shows a detailed view of an alignment structure 410 including a plurality of recess structures, wherein a buried optical alignment structure may be formed by annealing the alignment structure 410 (e.g. by annealing the plurality of recess structures), e.g. by applying process 120 of method 100, as described herein. According to various embodiments, the alignment structure 410 may include recess structures, wherein the recess structures may be formed by an arrangement 412 of recesses 414, in analogy as described referring to FIG. 3 and FIG. 4A.

Figure 5:
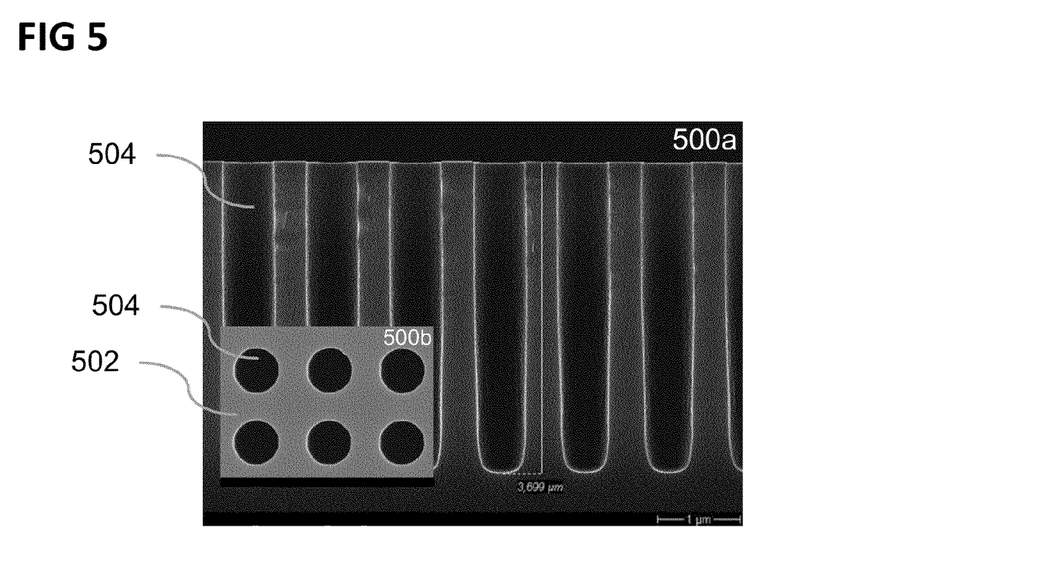
FIG. 5 shows a scanning electron microscopy image of a cross section of a carrier including a plurality of recesses and accordingly a top view thereof, according to various embodiments.

FIG. 5 shows a scanning electron microscopy image (SEM image) of a cross section 500a of a recess structure and a top view 500b of the recess structure. According to various embodiments, the recesses 504 may have a substantially cylindrical shape, e.g. a circular base area as shown in the top view 500b and a rectangular cross section as shown in the cross sectional view 500a. According to various embodiments, the carrier 502 may be a silicon substrate. According to various embodiments, the recesses 504 may have a diameter of about 0.6 µm and a depth of about 3.7 µm. According to various embodiments, the recesses 504 may have a pitch of about 1 µm. According to various embodiments, the recesses 504 may be formed by applying process 110 of method 100 as described herein.

Figure 6:
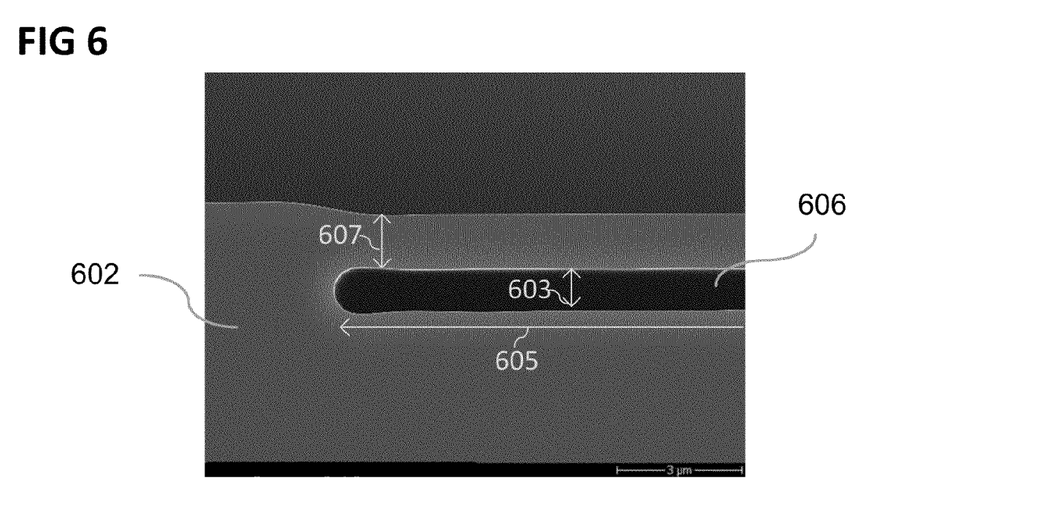
FIG. 6 shows a scanning electron microscopy image of a cross section of a carrier including a hollow chamber after an annealing process has been carried out, according to various embodiments.

FIG. 6 shows a scanning electron microscopy image (SEM image) of a cross section of carrier 602 after method 100 has been carried out, as described herein. According to various embodiments, the hollow chamber 606 formed in the carrier 602 may have a height 603 in the range from about 0.5 µm to about 2 µm, e.g. a height of about 1 µm. According to various embodiments, the hollow chamber 606 formed in the carrier 602 may have a width 605 in the range from about 8 µm or larger than about 8 µm. According to various embodiments, the layer 608, e.g. the silicon migration region 608, may have a thickness 607 or a height 607 in the range from about 0.5 µm to about 2 µm, e.g. of about 1 µm.

According to various embodiments, the hollow chamber 606, e.g. being used as optical alignment structure 606, may be detectable using infrared light through the layer 608, e.g. through the silicon migration region 608. According to various embodiments, the infrared light being used for the optical alignment may have a wavelength in the range from about 700 nm to about 1500 nm, e.g. in the range from about 1000 nm to about 1300 nm, e.g. in the range from about 1130 nm to about 1200 nm.

Figure 7:
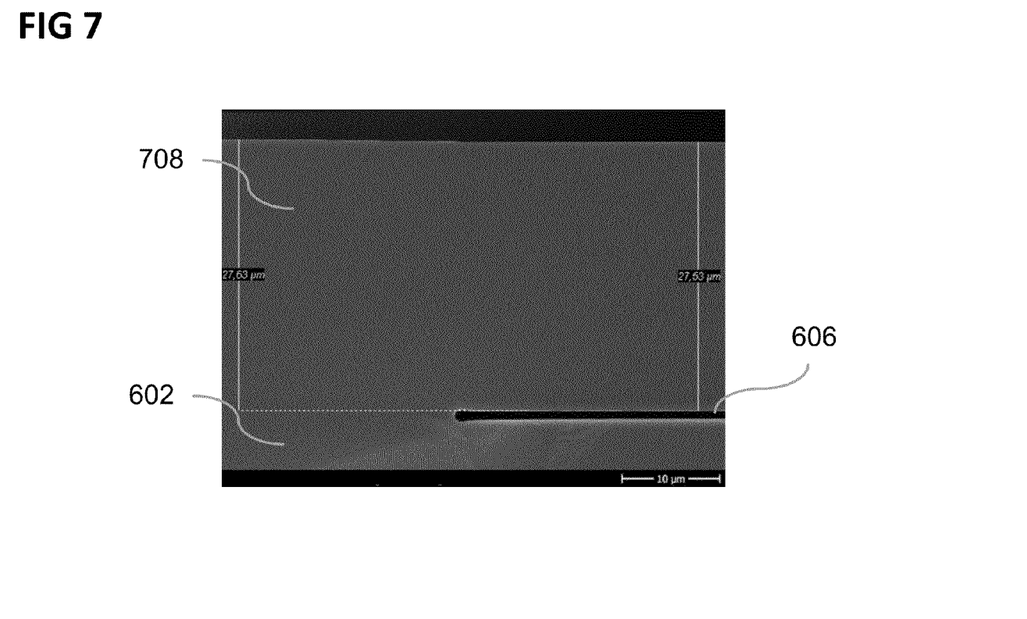
FIG. 7 shows a scanning electron microscopy image of a cross section of a carrier including an additional layer being deposited over the hollow chamber, according to various embodiments.

FIG. 7 shows a scanning electron microscopy image (SEM image) of a cross section of carrier 602 after method 100 has been carried out and after an additional layer 708 has been formed over the optical alignment structure 606 (e.g. the hollow chamber 606), and therefore, also over the carrier 602. According to various embodiments, the carrier 602 may be a silicon wafer, e.g. a single crystalline silicon substrate, and the additional layer 708 may be an epitaxially grown silicon layer 708. According to various embodiments, the layer 708 may be formed after method 100 has been carried out using at least one layering process, as described herein. According to various embodiments, the layer 708 may have a thickness in the range from about 5 µm to about 50 µm, e.g. in the range from about 20 µm to about 40 µm, e.g. of about 30 µm.

According to various embodiments, depending on the doping concentration of a silicon layer deposited over the optical alignment structure, the optical alignment structure may be detectable through a silicon layer having a thickness up to several hundreds of micrometers.

According to various embodiments, the hollow chamber 606, e.g. serving as an optical alignment structure 606 or as a part of an optical alignment structure 606, may be visible or detectable using infrared light (e.g. using an infrared light alignment tool) through the additional layer 708 (e.g. through the additional epitaxial silicon layer 708 and the silicon migration layer). According to various embodiments, the layer 708 may also include polycrystalline silicon, nanocrystalline silicon, or doped silicon. According to various embodiments, the layer 708 may be a layer stack including various layers, e.g. including at least one of a silicon layer, a doped silicon layer, and any other material being substantially transparent to infrared light.

According to various embodiments, the optical alignment structure including at least one hollow chamber or a plurality of hollow chambers may be covered with additional material (e.g. in analogy to layer 708 as shown in FIG. 7) during a further manufacturing process, e.g. to manufacture a power chip. According to various embodiments, the further manufacturing process may include several layering processes, patterning processes, and ion implantation processes, such that the optical alignment structure may be covered by various material layers, wherein the optical alignment structure may be visible or detectable using infrared light through all of these material layers covering the optical alignment structure (e.g. covering the hollow chamber or the plurality of hollow chambers).

According to various embodiments, the optical alignment structure may be covered with a number of silicon layers or doped silicon layers, e.g. a number between 2 and 20, e.g. 12, each having a thickness in the micrometer range. According to various embodiments, while the carrier may be further processed, the optical alignment structure may be visible through the material, which may cover the optical alignment structure (e.g. through a number of silicon layers or doped silicon layers as described before), such that in a further process, wherein an alignment may be necessary, the overlay accuracy may be maintained as it is required by the specific further process. According to various embodiments, an overlay error for the alignment of the carrier using the optical alignment structure as described herein may be below 200 nm, or e.g. below 100 nm. Referring to this, according to various embodiments, the overlay accuracy may remain constant during a further process, even if the optical alignment structure may be covered with additional material, since the optical alignment uses infrared light to detect the hollow chambers, such that the optical alignment may be substantially independent of a material, e.g. silicon, covering the optical alignment structure.

According to various embodiments, using method 100 as described herein may reduce the number of process steps during manufacturing an electronic device, e.g. during manufacturing a power chip, since the optical alignment structure may be visible even if the optical alignment structure may be covered with a material layer, e.g. a material layer having a thickness larger than about 10 µm, or larger than about 20 µm; therefore, the optical alignment structure may not need to be refreshed during a manufacturing process.

Figure 8:
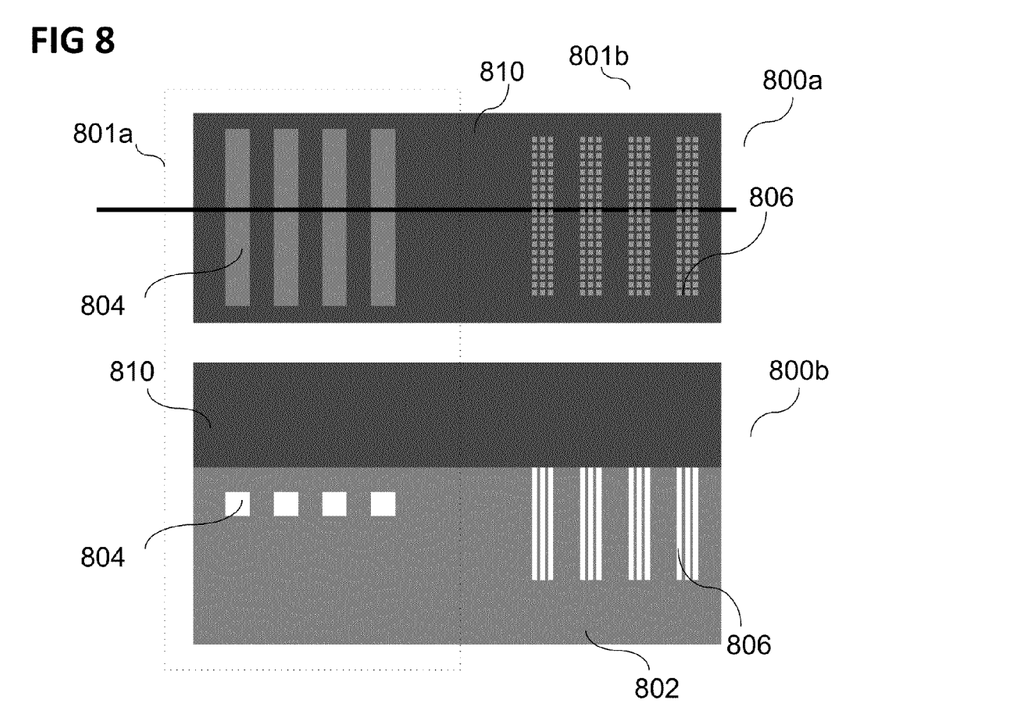
FIG. 8 illustrates a comparison between deep trench overlay marks and burrier overlay marks, according to various embodiments.

FIG. 8 shows a deep trench structure 801b compared to a buried optical alignment structure 801a, in top view 800a and cross sectional view 800b, including buried alignment marks 804, wherein the buried alignment marks 804 may be generated as described herein referring to method 100. According to various embodiments, the buried alignment marks 804 and the deep trenches 806 may be formed in the carrier 802. According to various embodiments, the carrier 802, e.g. a silicon substrate, may be covered with a layer 810, e.g. an epitaxial silicon layer. According to various embodiments, alignment structure 801a including buried alignment marks 804 may be visible or detectable through the material covering the alignment marks using infrared light, as described herein.

According to various embodiments, the optical alignment structure, as described herein, may be stable in shape and size during a subsequently performed processing. According to various embodiments, the shape and the size of the hollow chambers may not change if an additional material layer is deposited on top. Referring to this, commonly used trenches for optical alignment may change at least one of size, width, depth, and/or relative arrangement to each other during semiconductor processing, e.g. the edges of the trenches may shift depending on the thickness of an epitaxial layer being deposited over the trenches. According to various embodiments, the optical alignment structure, as described herein, may allow forming an improved optical alignment structure being stable despite an additional layer may be deposited over the optical alignment structure.

According to various embodiments, using method 100, as described herein, may increase the alignment accuracy of lithographic processes during manufacturing an electronic device, e.g. during manufacturing a power chip, since the optical alignment structure may be visible in a sufficiently high quality, even if the optical alignment structure may be covered with an additional material layer, such that indirect alignment processes may not be necessary, e.g. to refresh the optical alignment structure or to indirectly align a mask during a lithographic process.

According to various embodiments, the specific wavelength of the light being used to detect the optical alignment structure (e.g. to detect a hollow chamber) may be selected according to the transmission properties of the material covering the optical alignment structure. According to various embodiments, a wavelength of about 1130 nm may be used to detect the at least one hollow chamber through a silicon layer. According to various embodiments, infrared light having a wavelength of about 1030 nm may have the highest penetration depth through silicon layers and doped silicon layers, wherein light of this wavelength may be used for the alignment of the carrier using the optical alignment structure (e.g. using at least one hollow chamber or a plurality of hollow chambers).

According to various embodiments, the optical alignment structure, that means a hollow chamber or a plurality of hollow chambers, may be arranged in the kerf region of a silicon wafer. According to various embodiments, there may be at least two optical alignment structures arranged in the carrier to realize an alignment of a sufficiently high precision.

According to various embodiments, a plurality of optical alignment structures may be arranged in a carrier, e.g. up to 20 or e.g. up to 100 optical alignment structures.

According to various embodiments, the silicon mass diffusion may start from the recesses, holes or trenches included in the recess structure. According to various embodiments, forming the recess structure may be a simple patterning process of the carrier surface. The position of the recesses in the recess structure may be easily and accurately defined by the patterning of the carrier. Therefore, according to various embodiments, the optical alignment structure may be easily and accurately defined by the patterning of the carrier.

According to various embodiments, the size of the at least one hollow chamber formed by annealing the at least one recess structure may be easily and accurately defined by the patterning of the carrier, e.g. by the size, the shape and the arrangement of the recess in the at least one recess structure.

According to various embodiments, a method for processing a carrier may include forming at least one recess structure at least one of over and in the carrier; and annealing the at least one recess structure such that at least one hollow chamber may be formed by material of the at least one recess structure, wherein the at least one hollow chamber may form an optical alignment structure or at least a part of an optical alignment structure.

According to various embodiments, a method for processing a carrier may include forming at least one recess structure in the carrier; and annealing the at least one recess structure such that at least one hollow chamber may be formed by material of the at least one recess structure, wherein the at least one hollow chamber may form an optical alignment structure or at least a part of an optical alignment structure. According to various embodiments, forming at least one recess structure in the carrier may include patterning the carrier.

According to various embodiments, forming at least one recess structure may include forming a plurality of recesses. According to various embodiments, each recess of the plurality of recesses may be partially surrounded by carrier material. According to various embodiments, the carrier material may include silicon or may consist of silicon.

According to various embodiments, forming at least one recess structure may include forming a plurality of recesses, wherein each recess of the plurality of recess may be partially surrounded by a recess structure material. According to various embodiments, the recess structure material may cover the carrier. According to various embodiments, the recess structure material may include silicon or may consist of silicon.

According to various embodiments, forming at least one recess structure may include forming at least three recesses. According to various embodiments, forming at least one recess structure may include forming at least three recesses in a carrier.

According to various embodiments, each recess of the plurality of recesses may have a shape of a right prism.

According to various embodiments, each recess of the plurality of recesses may have a shape selected from a group of shapes consisting of: a hexagonal right prism; an octagonal right prism; and a cylinder.

According to various embodiments, each recess may be formed to have a width in a range from about 600 nm to about 900 nm.

According to various embodiments, each recess may be formed to have a depth in a range from about 2 µm to about 6 µm.

According to various embodiments, the pitch between two adjacent recesses of the plurality of recesses may be in a range from about 0.8 µm to about 1.5 µm.

According to various embodiments, forming a plurality of recesses may include forming a plurality of hexagonal right prisms, octagonal right prisms, or cylinders having a width in a range from about 100 nm to about 2 µm and a depth in a range from about 0.5 µm to about 10 µm.

According to various embodiments, forming at least one recess structure may include forming a plurality of recesses, wherein a distance between two adjacent recesses of the plurality of recesses may be in a range from about 0.2 µm to about 3 µm, measured from the center of a recess to the center of an adjacent recess.

According to various embodiments, the at least one hollow chamber formed during the annealing process may have a height in the range from about 0.5 µm to about 1.5 µm.

According to various embodiments, the at least one hollow chamber formed during the annealing process may have a width in the range from about 2 µm to about 8 µm.

According to various embodiments, the at least one hollow chamber formed during an annealing process may have a height in the range from about 0.5 µm to about 1.5 µm and a width in a range from about 2 µm to about 8 µm.

According to various embodiments, at least one hollow chamber may be formed using an annealing process at a temperature of at least about 900° C. The at least one hollow chamber may be formed using an annealing process at a temperature of at least about 1150° C. According to various embodiments, an annealing process may be a thermal treatment.

According to various embodiments, an optical alignment structure may be formed to be detectable by an infrared alignment tool using light with a wavelength in the range from about 1000 nm to about 1200 nm. According to various embodiments, an optical alignment structure may be formed to be detectable by an infrared alignment tool using light with a wavelength of about 1130 nm.

According to various embodiments, the at least one hollow chamber may be formed in a kerf region of a wafer. According to various embodiments, since the at least one hollow chamber may be at least a part of a buried optical alignment structure, the at least one hollow chamber may be formed in any desired region of the carrier.

According to various embodiments, the carrier may be a silicon wafer and the at least one hollow chamber may be formed during the annealing process of the at least one recess structure by silicon mass diffusion starting from the at least one recess structure. According to various embodiments, the carrier may be a silicon wafer and the at least one hollow chamber may be formed during the annealing process by silicon migration starting from the at least one recess structure.

According to various embodiments, forming at least one recess structure and annealing the at least one recess structure may include forming a plurality of recess structures and annealing the plurality of recess structures such that a plurality of hollow chambers may be formed by the respective material of the plurality of recess structures, wherein the plurality of hollow chambers may form an optical alignment structure. According to various embodiments, forming at least one recess structure and annealing the at least one recess structure may include forming a plurality of recess structures and annealing the plurality of recess structures such that a plurality of hollow chambers may be formed by the respective material of the plurality of recess structures, wherein the plurality of hollow chambers may form a plurality of optical alignment structures.

According to various embodiments, each hollow chamber of the plurality of hollow chambers may be respectively formed by a recess structure including at least three recesses. According to various embodiments, each hollow chamber of the plurality of hollow chambers may be respectively formed by a recess structure including at least one recess, e.g. forming a spherical alignment structure.

According to various embodiments, method 100 of processing a carrier may further include depositing at least one additional layer over the optical alignment structure. According to various embodiments, the additional layer may be a silicon layer. According to various embodiments, the additional layer may include at least one of silicon and doped silicon. According to various embodiments, method 100, as described herein, may be used for manufacturing a chip, e.g. a power chip, using the optical alignment structure and an infrared alignment tool, as described herein.

According to various embodiments, the at least one additional layer may have a thickness larger than about 5 µm. According to various embodiments, the at least one additional layer (deposited over the optical alignment structure) may have a thickness larger than about 10 µm. According to various embodiments, the at least one additional layer (deposited over the optical alignment structure) may have a thickness larger than about 20 µm. According to various embodiments, the at least one additional layer (deposited over the optical alignment structure) may have a thickness larger than about 30 µm.

According to various embodiments, a so-called venetia process may be utilized for processing a carrier to form an optical alignment structure. According to various embodiments, an optical alignment structure generated by a venetia process may be used in a lithographic process to align a carrier. According to various embodiments, a venetia process may include forming at least one hollow chamber in a carrier, as described herein referring to method 100.

According to various embodiments, an empty space in silicon technique may be used for processing a silicon wafer to form an optical alignment structure for applying a lithographic process. According to various embodiments, an empty space in silicon technique may include forming at least one hollow chamber in a carrier, as described herein referring to method 100.

According to various embodiments, a method for forming an optical alignment structure for a lithographic process in a carrier may include: providing the carrier; and carrying out a venetia process to process the carrier to form the optical alignment structure.

According to various embodiments, a method for forming an optical alignment structure for a lithographic process in a carrier may include: providing the carrier; and carrying out an empty space in silicon technique process to process the carrier to form the optical alignment structure.

According to various embodiments, a carrier may include at least one hollow chamber arranged in the carrier, wherein the at least one hollow chamber may form an optical alignment structure. According to various embodiments, a carrier may include a plurality of hollow chambers arranged in the carrier, wherein the plurality of hollow chambers may provide an optical alignment structure. According to various embodiments, a carrier may include a plurality of hollow chambers arranged in the carrier, wherein the plurality of hollow chambers may provide a plurality of optical alignment structures.

According to various embodiments, a carrier may include at least one optical alignment structure formed by at least one hollow chamber arranged in the carrier.

According to various embodiments, a carrier may include an optical alignment structure being configured to be detectable by infrared light.

According to various embodiments, the optical alignment structure may be designed to be detectable by infrared light. According to various embodiments, the optical alignment structure may have a size in the micrometer range. According to various embodiments, the optical alignment structure may have a shape, which may allow an accurate positioning (alignment of the carrier).

According to various embodiments, the carrier may be a silicon wafer and the hollow chamber may be arranged in the silicon wafer. According to various embodiments, the hollow chamber may be completely surrounded by silicon.

According to various embodiments, the at least one hollow chamber may be covered with a silicon layer having a thickness in the range from about 0.5 µm to about 50 µm. According to various embodiments, the at least one hollow chamber may be completely covered with a silicon layer having a thickness in the range from about 0.5 µm to about 50 µm. According to various embodiments, a hollow chamber covered with a silicon layer having a thickness in the range from about 0.5 µm to about 50 µm may be used as an optical alignment structure using infrared light.

According to various embodiments, the optical alignment structure may include more than one hollow chamber.

According to various embodiments, the optical alignment structure may be covered by an epitaxially grown layer, e.g. an epitaxially grown silicon layer. According to various embodiments, the optical alignment structure may be covered by an epitaxially grown layer, e.g. an epitaxially grown silicon layer, having a thickness larger than 5 µm. According to various embodiments, the optical alignment structure may be covered by an epitaxially grown layer, e.g. an epitaxially grown silicon layer, having a thickness larger than 10 µm. According to various embodiments, the optical alignment structure may be covered by an epitaxially grown layer, e.g. an epitaxially grown silicon layer, having a thickness larger than 20 µm. According to various embodiments, the optical alignment structure may be covered by an epitaxially grown layer, e.g. an epitaxially grown silicon layer, having a thickness larger than 30 µm, e.g. having a thickness larger than 100 µm.

According to various embodiments, the optical alignment structure may be formed to be detectable by an optical alignment tool. According to various embodiments, the optical alignment structure may be formed to be detectable by an alignment tool using light with a wavelength in the range from about 500 nm to about 1200 nm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a carrier, the method comprising:
    forming at least two recess structures at least one of over and in the carrier, wherein each of the at least two recess structures comprises a plurality of recesses, wherein a first recess structure of the at least two recess structures comprises more recesses than a second recess structure of the at least two recess structures;
    annealing the at least two recess structures such that at least two hollow chambers are formed by material of the at least one two recess structures, wherein the at least two hollow chambers comprise a first hollow chamber formed by the first recess structure and a second hollow chamber formed by the second recess structure, wherein the size of the first hollow chamber is greater than the size of the second hollow chamber, wherein the at least two hollow chambers form an optical alignment structure.

2. The method according to claim 1,
    wherein the material of the at least two recess structures comprises silicon.

3. The method according to claim 1,
    wherein forming the at least two recess structures comprises forming at least three recesses.

4. The method according to claim 1,
    wherein each recess of the plurality of recesses has a shape of a right prism.

5. The method according to claim 1,
    wherein each recess of the plurality of recesses has a shape selected from a group of shapes consisting of:
        a hexagonal right prism;
        an octagonal right prism; and
        a cylinder.

6. The method according to claim 5,
    wherein each recess is formed to have a width in a range from about 600 nm to about 900 nm.

7. The method according to claim 5,
    wherein each recess is formed to have a depth in a range from about 0.5 µm to about 10 µm.

8. The method according to claim 1,
    wherein a pitch between two adjacent recesses of the plurality of recesses is in a range from about 0.8 µm to about 1.5 µm.

9. The method according to claim 1,
    wherein the at least two hollow chambers formed during the annealing process have a height in the range from about 0.1 µm to about 2 µm.

10. The method according to claim 1,
    wherein the at least two hollow chambers formed during the annealing process have a width in the range from about 0.5 µm to about 10 µm.

11. The method according to claim 1,
    wherein the at least two hollow chambers are formed by the annealing process at a temperature of at least about 900° C.

12. The method according to claim 1,
    wherein the optical alignment structure is formed to be detectable by an infrared alignment tool using light with a wavelength in the range from about 1000 nm to about 1200 nm.

13. The method according to claim 1,
    wherein the at least two hollow chambers are formed in a kerf region of a wafer.

14. The method according to claim 1,
    wherein the carrier is a silicon wafer and the at least two hollow chambers are formed during the annealing process by silicon migration starting from the at least one two recess structures.

15. The method according to claim 1,
    wherein forming at least two recess structures and annealing the at least two recess structures comprise forming a plurality of recess structures and annealing the plurality of recess structures such that a plurality of hollow chambers is formed by respective material of the plurality of recess structures, wherein the plurality of hollow chambers forms an optical alignment structure.

16. The method according to claim 15,
    wherein each hollow chamber of the plurality of hollow chambers is respectively formed by a recess structure including at least three recesses.

17. The method according to claim 1, further comprising,
    depositing at least one epitaxial layer over the optical alignment structure.

18. The method according to claim 17,
    wherein the at least one epitaxial layer has a layer thickness of at least 5 µm.

* * * * *